(12) United States Patent
Das et al.

(10) Patent No.: US 9,692,444 B1
(45) Date of Patent: Jun. 27, 2017

(54) NEUTRALIZING VOLTAGE KICKBACK IN A SWITCHED CAPACITOR BASED DATA CONVERTER

(71) Applicant: Cirrus Logic International Semiconductor Ltd., Edinburgh (GB)

(72) Inventors: Tejasvi Das, Austin, TX (US); John L. Melanson, Austin, TX (US); Ramin Zanbaghi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/198,982

(22) Filed: Jun. 30, 2016

(51) Int. Cl.
*H03M 3/00* (2006.01)

(52) U.S. Cl.
CPC .......... *H03M 3/322* (2013.01); *H03M 3/424* (2013.01); *H03M 3/464* (2013.01); *H03M 3/50* (2013.01)

(58) Field of Classification Search
None
See application file for complete search history.

(56) References Cited

U.S. PATENT DOCUMENTS

| | | | | |
|---|---|---|---|---|
| 7,710,304 B2* | 5/2010 | Kumamoto | ........... | H03M 3/376 341/143 |
| 8,258,818 B2* | 9/2012 | Debnath | .............. | G11C 27/024 327/337 |
| 8,471,740 B2* | 6/2013 | Dinc | .................... | H03M 1/0641 341/118 |
| 8,749,425 B1* | 6/2014 | Hu | ....................... | H03M 1/0845 341/155 |
| 2009/0027247 A1 | 1/2009 | Kumamoto et al. | | |

OTHER PUBLICATIONS

International Search Report and Written Opinion of the International Searching Authority, International Application No. PCT/US2016/040480, mailed Mar. 1, 2017.

* cited by examiner

*Primary Examiner* — Howard Williams
(74) *Attorney, Agent, or Firm* — Jackson Walker L.L.P.

(57) ABSTRACT

In accordance with embodiments of the present disclosure, a method of neutralizing voltage kickback associated with a reference buffer of a switched capacitor based data converter having a first switched capacitor coupled to an output node of the reference buffer wherein the first switched capacitor comprises at least one first capacitor and at least one first switch may be provided. The method may include coupling a passive network to the output node of the reference buffer in response to a presence of a condition for encountering the voltage kickback in order to create an approximately equal and opposite voltage kickforward by the passive network to at least partially neutralize the voltage kickback.

52 Claims, 7 Drawing Sheets

NEUTRALIZING VOLTAGE KICKBACK IN A SWITCHED CAPACITOR BASED DATA CONVERTER

FIELD OF DISCLOSURE

The present disclosure relates in general to the field of electronics, and more specifically to systems and methods for neutralizing voltage kickback in a switched capacitor based data converter.

BACKGROUND

Delta-sigma modulators are particularly useful in digital-to-analog and analog-to-digital converters (DACs and ADCs). Using oversampling, a delta-sigma modulator spreads the quantization noise power across an oversampling frequency band, which is typically much greater than the input signal bandwidth. Additionally, the delta-sigma modulator performs noise shaping by acting as a low-pass filter to the input signal and a high-pass filter to the noise; hence, most of the quantization noise power is thereby shifted out of the signal band.

The typical delta-sigma modulator includes a summer summing the input signal with negative feedback, a linear filter, a quantizer, and a feedback loop with a digital-to-analog converter coupling the quantizer output and the inverting input of the summer. In a first order modulator, the linear filter comprises a single integrator stage while the filter in a higher order modulator comprises a cascade of a corresponding number of integrator stages. The quantizer can be either a one-bit or a multiple-bit quantizer. Higher-order modulators have improved quantization noise transfer characteristics over those of lower order, but stability becomes a more critical design factor as the order increases.

Switched-capacitor based filters/integrators are useful in a number of applications including the integrator stages in delta-sigma modulators and in other data converters. Generally, a basic differential switched-capacitor integrator samples the input signal, and often a reference voltage as well, onto a corresponding pair of sampling capacitors during the sampling (charging) phase, in a process sometimes referred to as "double sampling." During the following second phase, the charge on the sampling capacitor is transferred at the summing nodes of an operational amplifier to a corresponding pair of integrator capacitors in the amplifier feedback loops. The operational amplifier drives the integrator output. An example input network 100 for a delta-sigma modulator is depicted in FIG. 1.

Example input network 100 of FIG. 1 generally operates in accordance with a clock signal CLK, the complement of which is a signal CLK'. Each of clock signals CLK and CLK' may comprise a square-wave signal, as shown in FIG. 1. Clock signals CLK and CLK' may define clock cycles operating at a sampling rate wherein each clock cycle includes a first phase when clock signal CLK is high and clock signal CLK' is low and a second phase when clock signal CLK is low and clock signal CLK' is high. Generally, during the first phase of each cycle, switches 102 and 108 close and charges proportional to the reference voltages $v^+$ and v– generated by reference buffers 101 at the inputs to input network 100 are respectively sampled onto cross-coupled sampling capacitors 110a and 110b, respectively. During the second phase of each cycle, switches 104 and 106 close, and the input voltages $v^+$ and v– are coupled to the input plates of sampling capacitors 110a and 110b, respectively. Consequently the charges sampled onto sampling capacitors 110a and 110b during the first phase are respectively forced onto integration capacitors 114a and 114b which are each coupled between inputs and outputs of an integrator 112.

One disadvantage of such an input network is that kickbacks or voltage steps may occur when a sampling capacitor 110 is switched from positive reference voltage $v^+$ to negative reference voltage $v^-$, and vice versa. Accordingly, in such input networks (and in other data converter architectures relying on switched capacitors for sampling and other functions) buffers 100 generating reference voltages $v^+$ and $v^-$ must be designed with adequate bandwidth to settle the kickback within a sampling window.

SUMMARY

In accordance with the teachings of the present disclosure, certain disadvantages and problems associated with voltage kickback in a data converter may be reduced or eliminated.

In accordance with embodiments of the present disclosure, a method of neutralizing voltage kickback associated with a reference buffer of a switched capacitor based data converter having a first switched capacitor coupled to an output node of the reference buffer wherein the first switched capacitor comprises at least one first capacitor and at least one first switch may be provided. The method may include coupling a passive network to the output node of the reference buffer in response to a presence of a condition for encountering the voltage kickback in order to create an approximately equal and opposite voltage kickforward by the passive network to at least partially neutralize the voltage kickback.

In accordance with these and other embodiments of the present disclosure, a circuit for a switched capacitor based data converter may include a reference buffer for generating a reference voltage at an output node of the reference buffer, a first switched capacitor coupled to the output node of the reference buffer wherein the first switched capacitor comprises at least one first capacitor and at least one first switch, and a passive network configured to be coupled to the output node of the reference buffer in response to a presence of a condition for encountering a voltage kickback associated with the reference buffer in order to create an approximately equal and opposite voltage kickforward by the passive network to at least partially neutralize the voltage kickback.

Technical advantages of the present disclosure may be readily apparent to one of ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
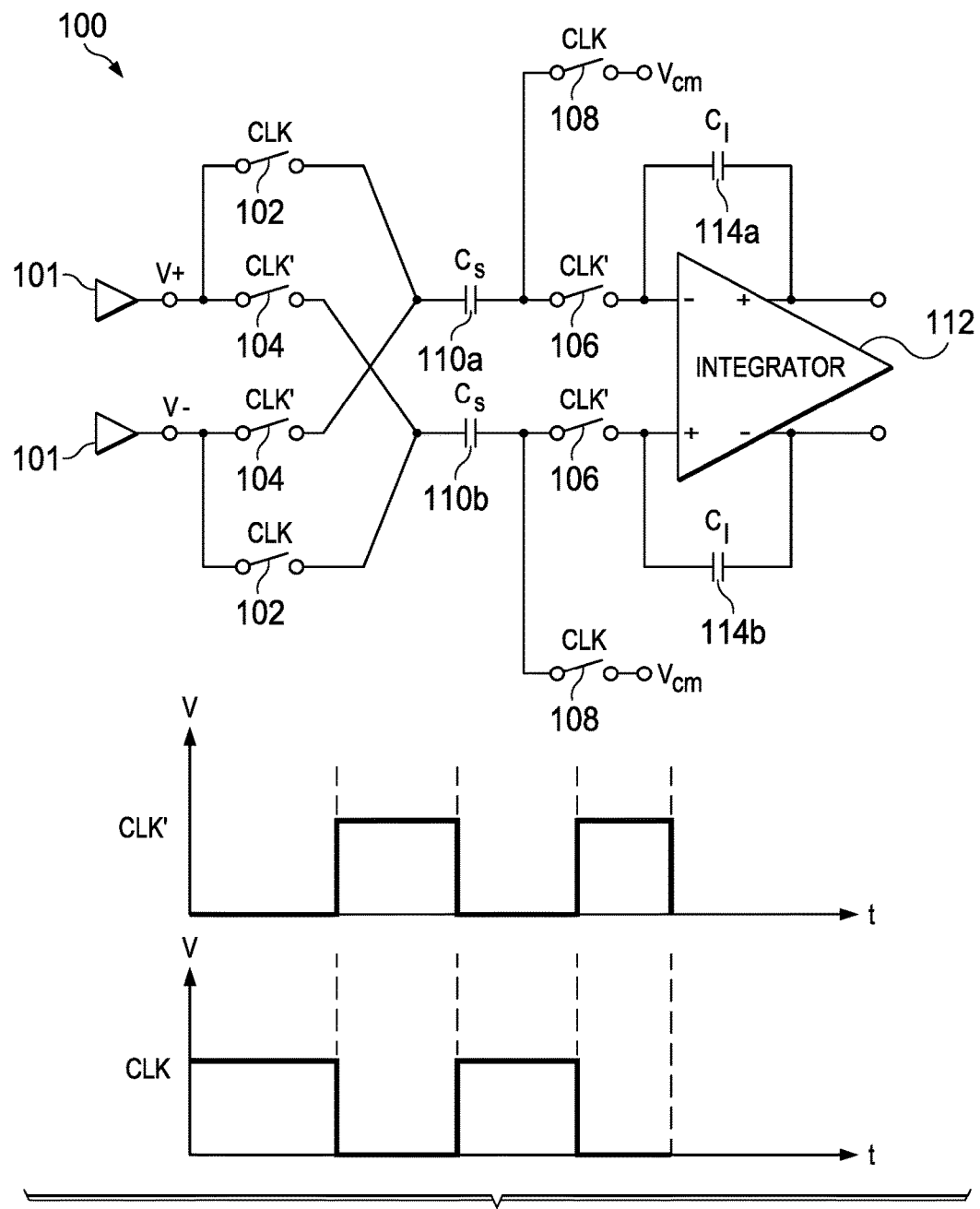
FIG. 1 illustrates a block diagram of an input sampling network for a delta-sigma modulator, as is known in the art.
Figure 2:
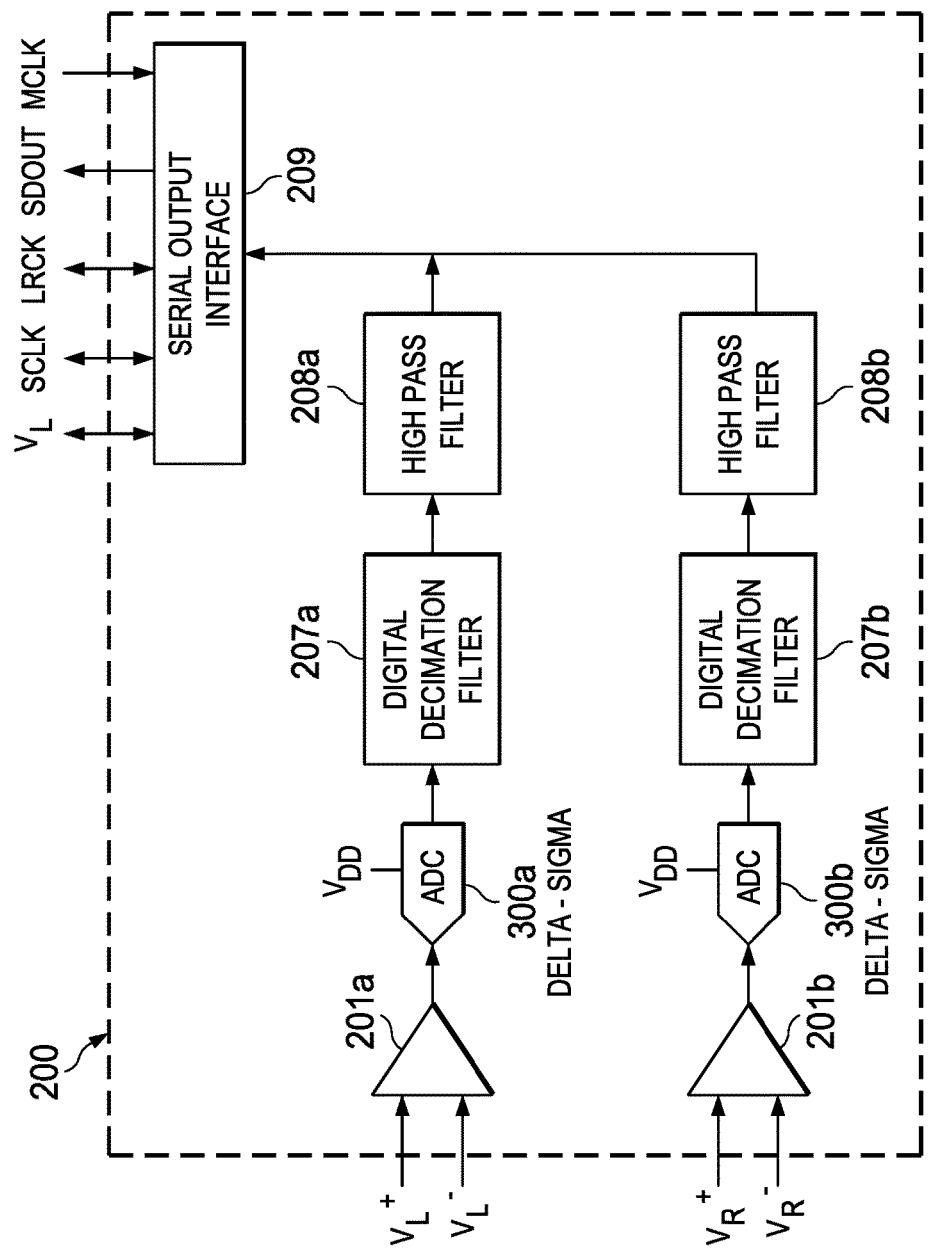
FIG. 2 illustrates a high-level block diagram of an analog-to-digital converter, in accordance with embodiments of the present disclosure.

FIG. 2 illustrates a high-level block diagram of an analog-to-digital converter 200, in accordance with embodiments of the present disclosure. Analog-to-digital converter 200 is only one of a number of possible applications that may employ delta-sigma data modulators. Other examples include digital-to-analog converters and coder-decoders (codecs).

Analog-to-digital converter 200 may include two conversion paths for converting left and right channel analog audio data respectively received at left and right analog differential inputs $v_L^+/v_L^-$ and $v_R^+/v_R^-$. The analog input signals may be respectively passed through input gain stages 201a and 201b and then to delta-sigma analog-to-digital converters (ADCs) 300a and 300b, which may be powered from a steady state supply voltage $V_{DD}$ and which are described in greater detail with respect to FIG. 3, below. The digital outputs of delta-sigma ADCs 300a and 300b may be passed through corresponding decimation filters 207a and 207b, which may reduce the sample rate, and high-pass filters 208a and 208b which may filter out high-frequency harmonic noise from the respective digital signals. Delta-sigma ADCs 300a and 300b may sample the analog signal at an oversampling rate and output digital data, in either single-bit or multiple-bit form depending on the quantization, at the oversampling rate. The resulting quantization noise is shaped and generally shifted to frequencies above the audio band.

The resulting left and right channel digital audio data may be output through a single serial port SDOUT of a serial output interface 209, timed with serial clock SCLK and left-right clock LRCK in accordance with the Digital Interface Format (DIF). The SCLK and LRCK clocks can be generated externally and input to converter 200 or can be generated on-chip, along with the associated data, in response to a received master clock MCLK.

Figure 3:
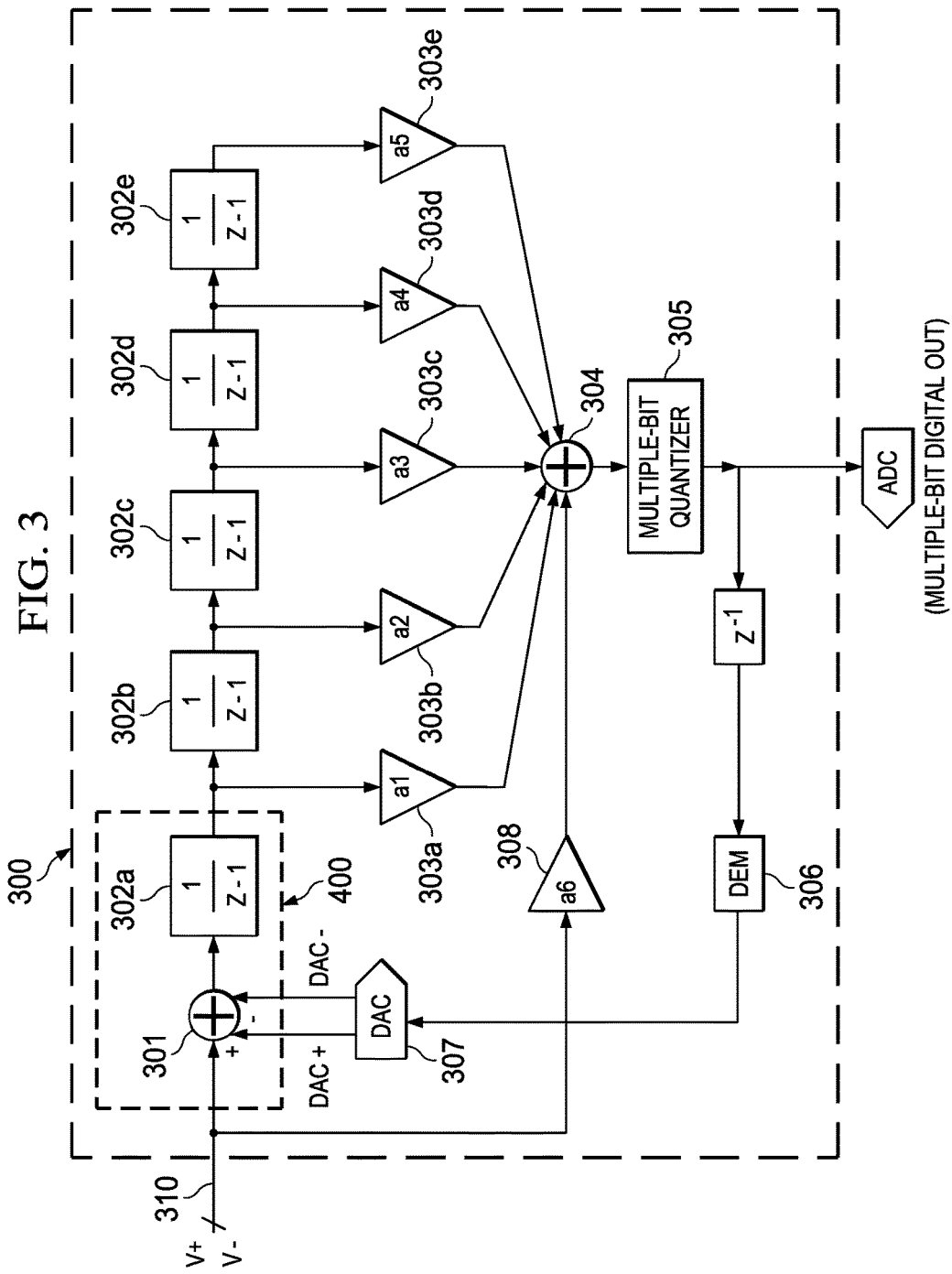
FIG. 3 illustrates a block diagram of an example delta-sigma feedforward modulator, in accordance with embodiments of the present disclosure.

FIG. 3 illustrates a block diagram of an example delta-sigma feed-forward modulator 300, in accordance with embodiments of the present disclosure. Modulator 300 may be a suitable modulator that may be used as or part of either or both of delta-sigma ADCs 300a and 300b depicted in FIG. 2. Delta-sigma modulator 300 may include an input summer 301 and one or more integrator stages 302. Although any suitable number of integrator stages may be used, in the embodiments represented by FIG. 3, delta-sigma modulator 300 includes five integrator stages 302a-302e, and thus delta-sigma modulator 300 depicted in FIG. 3 is a fifth-order delta-sigma modulator. Delta-sigma modulator 300 may include a weighted feed-forward design in which the outputs of each of the integrator stages may be passed through a respective gain stage (amplifier) 303 (e.g., 303a-303e) to an output summer 304. Amplifiers 303 may allow the outputs of the integrator stages to be weighted at the input of summer 304. The output from summer 304 may be quantized by a multiple-bit quantizer 305, which may generate a multiple-bit digital output signal labeled as ADC in FIG. 3. Additionally, the output from quantizer 305 may be fed back to the inverting input of summer 301 through dynamic element matching (DEM) circuitry 306 and multiple-bit digital-to-analog converter (DAC) 307.

FIG. 3 also depicts an additional feed-forward path, including amplifier 308, between modulator input 310 and summer 304. The gain of amplifier stage 308 may be given by the equation gain=(1/Quantizer gain)(1/Multi-Bit DAC gain). The purpose of this additional feed-forward path is to cancel as much of the input signal energy from the delta-sigma loop as possible. Consequently, most of the voltage swing within the modulator may be quantization noise. In turn, the design constraints on the sub-circuits within modulator 300 may be relaxed. For example, the first integrator stage 302a is typically the major contributor to the noise performance of the entire modulator. This feed-forward technique results in less signal energy at the outputs of the integrator stages, and hence such parameters as the stage operation amplifier (opamp) DC gain may be reduced. In turn, the power consumption of the device as well as the die size may be reduced.

A fifth-order feed-forward design was selected for discussion purposes; in actual implementation, the order as well as the configuration of the modulator may vary.

Figure 4A:
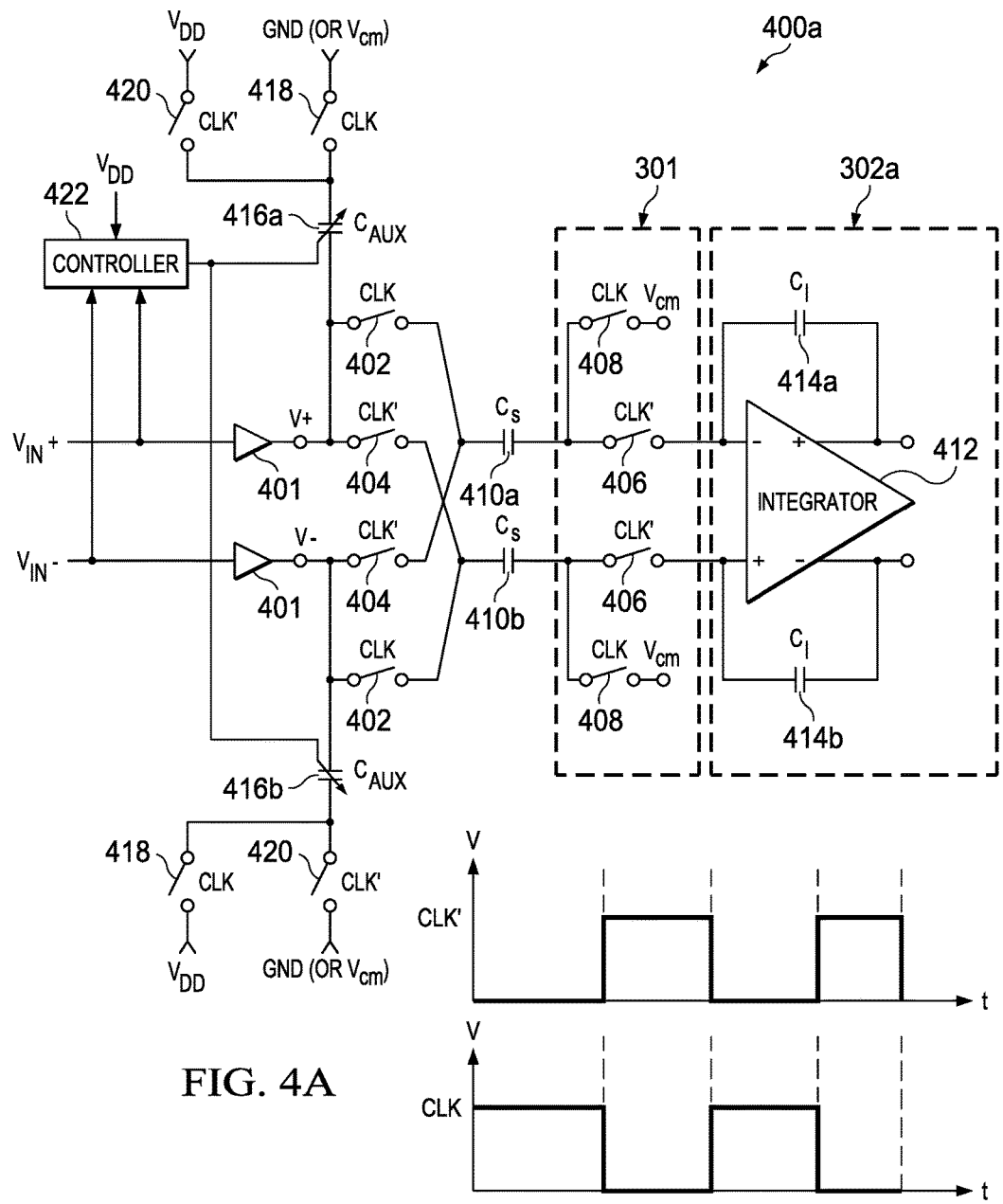
FIG. 4A illustrates a block diagram of an input sampling network for a delta-sigma modulator, in accordance with embodiments of the present disclosure.

FIG. 4A illustrates a block diagram of an input sampling network 400a, in accordance with embodiments of the present disclosure. In some embodiments, input sampling network 400a may be utilized as input summer 301 and first stage 302a of delta-sigma modulator 300 of FIG. 3, although its utility is not limited thereto.

Input sampling network 400a generally operates in accordance with a clock signal CLK, the complement of which is a signal CLK'. Each of clock signals CLK and CLK' may comprise a square-wave signal, as shown in FIG. 4A. Clock signals CLK and CLK' may define clock cycles operating at a sampling rate wherein each clock cycle includes a first phase when clock signal CLK is high and clock signal CLK' is low and a second phase when clock signal CLK is low and clock signal CLK' is high.

Generally, during the first phase of each cycle, switches 402 and 408 may close and charges proportional to the reference voltages $v^+$ and $v-$ generated by reference buffers 401 at the inputs to input network 400a may be respectively sampled onto cross-coupled sampling capacitors 410a and 410b, respectively, wherein each sampling capacitor has a capacitance $C_S$. During the second phase of each cycle, switches 404 and 406 may close, and the input voltages $v^+$ and $v-$ may be coupled to the input plates of sampling capacitors 410a and 410b, respectively. Consequently the charges sampled onto sampling capacitors 410a and 410b during the first phase may be respectively forced onto integration capacitors 414a and 414b which each may have capacitances of $C_I$ and each of which may be coupled between inputs and outputs of an integrator 412.

As shown in FIG. 4A, input network 400a may also include passive networks respectively associated with the output nodes of reference buffers 401, each passive network comprising a capacitor 416 with a variable capacitance $C_{AUX}$, and each passive network comprising switches 418 and 420. Generally, during the first phase of each cycle, switches 418 may close such that capacitor 416a is coupled between the reference buffer output node having reference voltage $v^+$ generated from an input signal $v_{in}^+$ and a steady state ground voltage (or in some embodiments, a steady state common mode voltage $V_{cm}$ already present within input summer 301) and such that capacitor 416b is coupled between the reference buffer output node having reference voltage $v^-$ generated from an input signal $v_{in}^-$ and a steady state supply voltage $V_{DD}$ that may already be present for powering one or more other components of ADC 200 and/or delta-sigma ADCs 300. Similarly, during the second phase of each cycle, switches 420 may close such that capacitor 416a is coupled between the reference buffer output node having reference voltage $v^+$ generated from input signal $v_{in}^+$ and the steady state supply voltage $V_{DD}$ and such that capacitor 416b is coupled between the reference buffer output node having reference voltage $v^-$ and input signal $v_{in}^-$ and the steady state ground voltage (or in some embodiments, the steady state common mode voltage $V_{cm}$). As a result, each passive network may be configured to be coupled to the output node of its respective reference buffer 401 in response to a presence of a condition for encountering a voltage kickback associated with the reference buffer 401 in order to create an approximately equal and opposite voltage kickforward by the passive network to at least partially neutralize the voltage kickback. Such condition for encountering a voltage kickback associated with a reference buffer 401 may be the closing of a switch (e.g., switches 402, 404) coupling the output node of the reference buffer 401 to a sampling capacitor 410a or 410b. In some embodiments, coupling the passive network to an output node of a reference buffer 401 to create the voltage kickforward may consume approximately no additional quiescent power.

As also shown in FIG. 4A, input network 400a may comprise a controller 422. In operation, controller 422 may monitor steady state supply voltage $V_{DD}$ and modify the variable capacitance $C_{AUX}$ of capacitors 416 responsive to changes of steady state supply voltage $V_{DD}$. For example, to maintain a desired amount of voltage kickforward in response to changes in steady state supply voltage $V_{DD}$, controller 422 may maintain variable capacitance $C_{AUX}$ to approximately equal a capacitance $C_S$ of a sampling capacitor 410 multiplied by a ratio equal to the respective input voltage steady state reference voltage (e.g., $v_{in}^+$ or $v_{in}^-$) generated at the output node of a reference buffer 401 divided by steady state supply voltage $V_{DD}$.

Figure 4B:
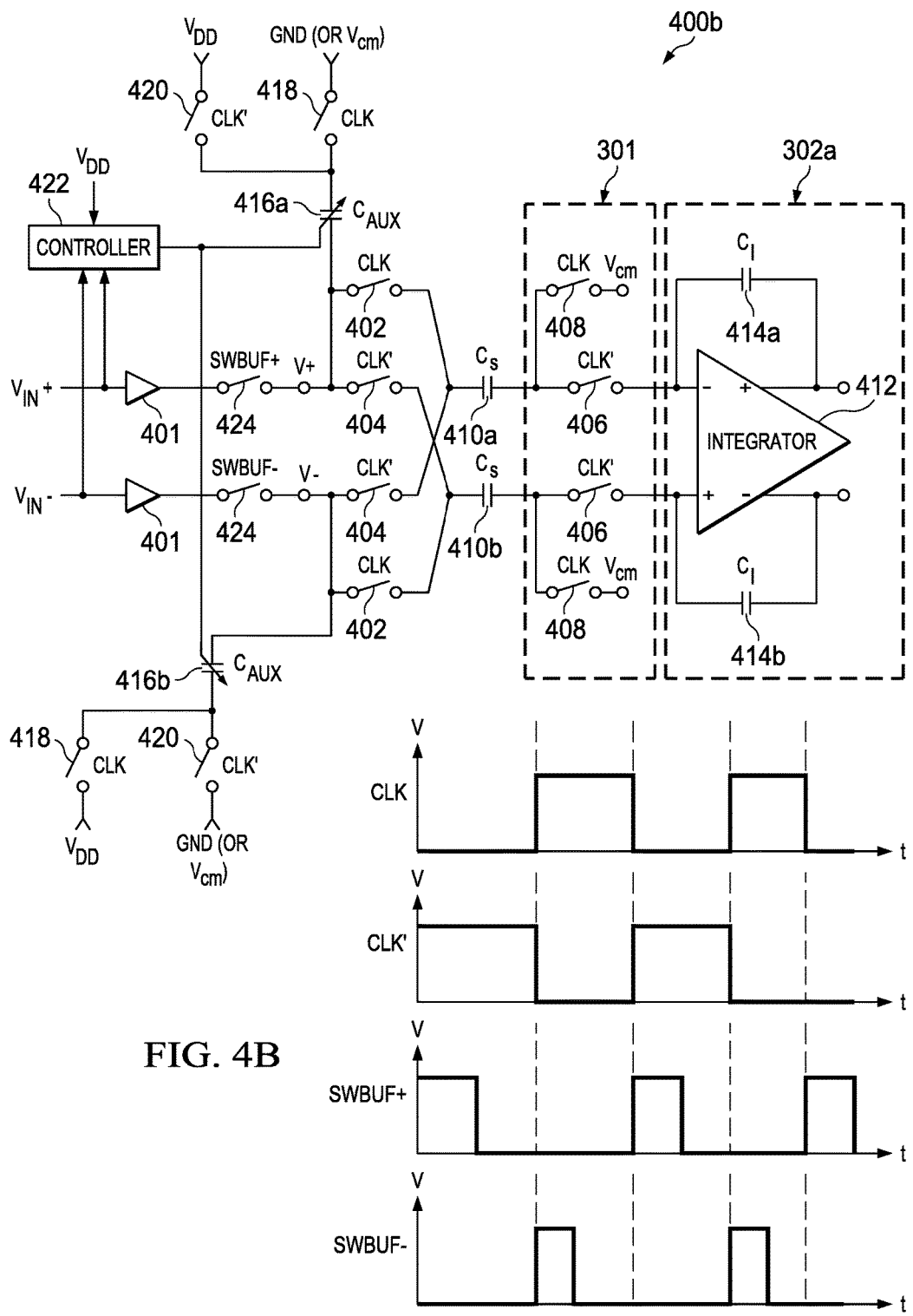
FIG. 4B illustrates a block diagram of another input sampling network for a delta-sigma modulator, in accordance with embodiments of the present disclosure.

FIG. 4B illustrates a block diagram of an input sampling network 400b, in accordance with embodiments of the present disclosure. In some embodiments, input sampling network 400b may be utilized as input summer 301 and first stage 302a of delta-sigma modulator 300 of FIG. 3, although its utility is not limited thereto. The structure and functionality of input sampling network 400b may be similar in many respects to that of input sampling network 400a of FIG. 4A, and thus, only the main differences between input sampling network 400b and input sampling network 400a are discussed.

One main difference between input sampling network 400b and input sampling network 400a is that input sampling network 400b may comprise switches 424, each switch 424 coupled between a reference buffer 401 and its respective output node. Such switches 424 may be controlled by a signal different from, but based on clock signal CLK, such that the output node of the reference buffer 401 is decoupled for at least a portion of a time in which the passive network is creating the voltage kickforward described above, so as to avoid kickback on the output voltages generated by reference buffers 401 and/or voltage sources of reference buffers 401.

Figure 5A:
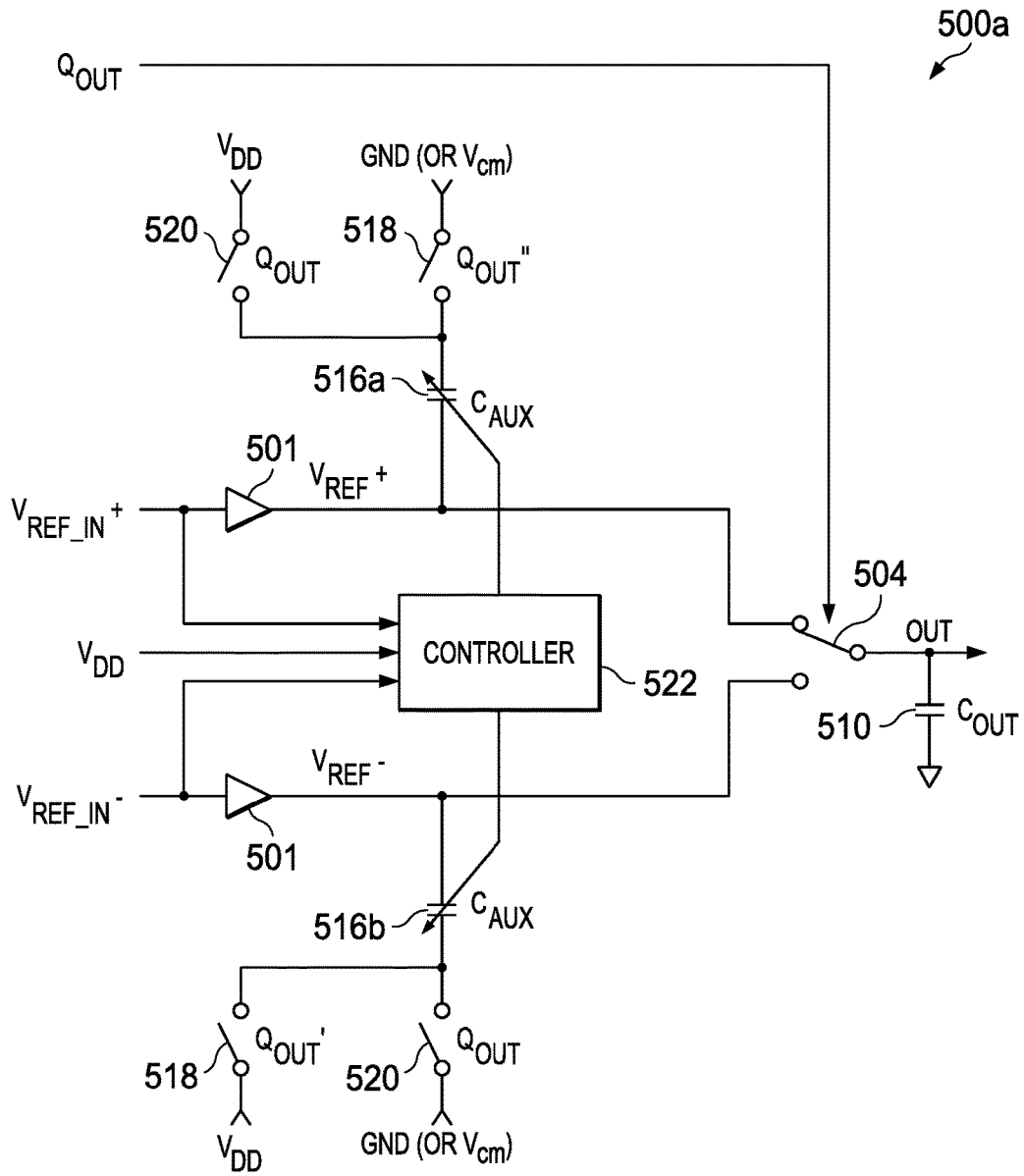
FIG. 5A illustrates a block diagram of a single-bit digital-to-analog converter for a delta-sigma modulator, in accordance with embodiments of the present disclosure.

FIG. 5A illustrates a block diagram of a single-bit digital-to-analog converter (DAC) 500a, in accordance with embodiments of the present disclosure. In some embodiments, DAC 500a may be utilized as a portion of a multiple-bit DAC (e.g., as a bit of DAC 307 of FIG. 3), although its utility is not limited thereto. DAC 500a may generally operate in accordance with a single-bit quantizer output signal $Q_{OUT}$ which may comprise a single-bit of a multiple-bit output signal generated by a quantizer (e.g., multiple-bit quantizer 305 of FIG. 3) or a derivative thereof (e.g., output of DEM circuitry 306 of FIG. 3). Generally, buffers 501 may respectively generate reference voltages $V_{REF}^+$ and $V_{REF}^-$ from respective input voltages $V_{REF\_IN}^+$ and $V_{REF\_IN}^+$. Single-bit quantizer output signal $Q_{OUT}$ may control a switch 504 that toggles between passing voltage $V_{REF}^+$ and voltage $V_{REF}^-$ as an output OUT of DAC 500a.

As shown in FIG. 5A, DAC 500a may also include passive networks respectively associated with the output nodes of reference buffers 501, each passive network comprising a capacitor 516 with a variable capacitance $C_{AUX}$, and each passive network comprising switches 518 and 520. The passive networks may generally operate in accordance with single-bit quantizer output signal $Q_{OUT}$. Generally, when single-bit quantizer output signal $Q_{OUT}$ is asserted (logic "high" or "1"), switches 518 may close (and switches 520 may open) such that capacitor 516a is coupled between the reference buffer output node having reference voltage $V_{REF}^+$ and a steady state ground voltage (or in some embodiments, a steady state common mode voltage $V_{cm}$ already present within input summer 301 or another component of delta-sigma modulator 300) and such that capacitor 516b is coupled between the reference buffer output node having reference voltage $V_{REF}^-$ and a steady state supply voltage $V_{DD}$ that may already be present for powering one or more other components of ADC 200 and/or delta-sigma ADCs 300. Similarly, when single-bit quantizer output signal $Q_{OUT}$ is de-asserted (logic "low" or "0"), switches 520 (and switches 518 may open) such that capacitor 516a is coupled between the reference buffer output node having reference voltage $V_{REF}^+$ and the steady state supply voltage $V_{DD}$ and such that capacitor 516b is coupled between the reference buffer output node having reference voltage $V_{REF}^-$ and the steady state ground voltage (or in some embodiments, the steady state common mode voltage $V_{cm}$). As a result, each passive network may be configured to be coupled to the output node of its respective reference buffer 501 in response to a presence of a condition for encountering a voltage kickback associated with the reference buffer 501 in order to create an approximately equal and opposite voltage kickforward by the passive network to at least partially neutralize the voltage kickback. Such condition for encountering a voltage kickback associated with a reference buffer 501 may be the closing of a switch (e.g., switching of switch 504) coupling the output node of the reference buffer 501 to the output of DAC 500. In some embodiments, coupling the passive network to an output node of a reference buffer 501 to create the voltage kickforward may consume approximately no additional quiescent power.

As also shown in FIG. 5A, DAC 500a may comprise a controller 522. In operation, controller 422 may monitor steady state supply voltage $V_{DD}$ and modify the variable capacitance $C_{AUX}$ of capacitors 416 responsive to changes of steady state supply voltage $V_{DD}$. For example, to maintain a desired amount of voltage kickforward in response to changes in steady state supply voltage $V_{DD}$, controller 522 may maintain variable capacitance $C_{AUX}$ to approximately equal a capacitance $C_{OUT}$ of an effective capacitance 510 at the output of DAC 500 multiplied by a ratio equal to the steady state reference voltage (e.g., $V_{REF}{}^+$ or $V_{REF}{}^-$) generated at the output node of a reference buffer 501 divided by steady state supply voltage $V_{DD}$.

Figure 5B:
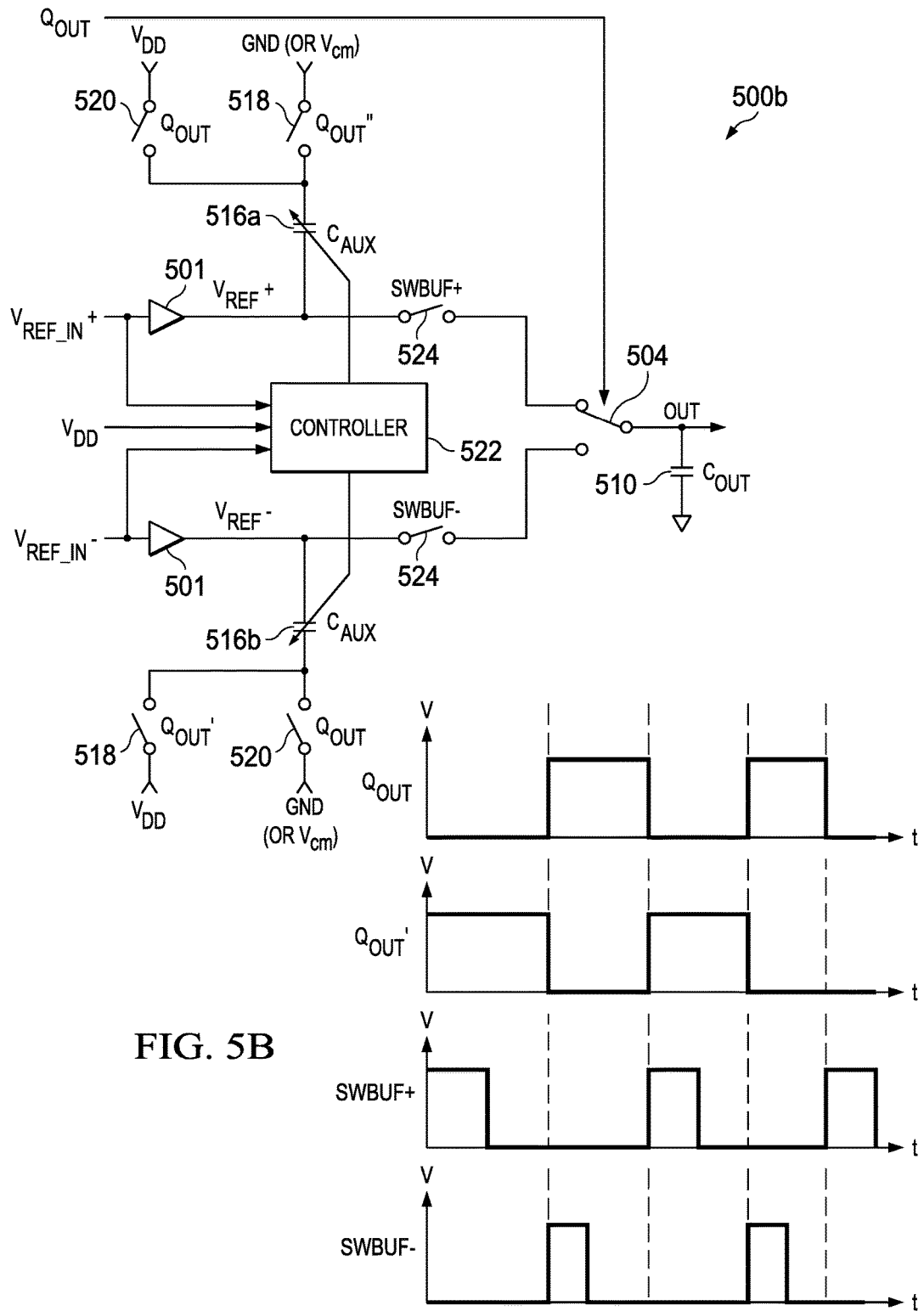
FIG. 5B illustrates a block diagram of another single-bit digital-to-analog converter for a delta-sigma modulator, in accordance with embodiments of the present disclosure.

FIG. 5B illustrates a block diagram of a DAC 500*b*, in accordance with embodiments of the present disclosure. In some embodiments, DAC 500*a* may be utilized as a portion of a multiple-bit DAC (e.g., as a bit of DAC 307 of FIG. 3), although its utility is not limited thereto. The structure and functionality of DAC 500*b* may be similar in many respects to that of DAC 500*b* of FIG. 5A, and thus, only the main differences between DAC 500*b* and DAC 500*a* are discussed.

One main difference between DAC 500*b* and DAC 500*a* is that DAC 500*b* may comprise switches 524, each switch 524 coupled between a reference buffer 501 and its respective output node. Such switches 524 may be controlled by a signal different from, but based on single-bit quantizer output signal $Q_{OUT}$, such that the output node of the reference buffer 401 is decoupled for at least a portion of a time in which the passive network is creating the voltage kickforward described above, so as to avoid kickback on the output voltages generated by reference buffers 501 and/or voltage sources of reference buffers 501.

Although the foregoing discussion contemplates neutralization of voltage kickback for a particular type of switched capacitor-based data converter, methods and systems similar or identical to those above may be applied to other types of switched capacitor-based data converters.

As used herein, when two or more elements are referred to as "coupled" to one another, such term indicates that such two or more elements are in electronic communication whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A method of neutralizing voltage kickback associated with a reference buffer of a switched capacitor based data converter having a first switched capacitor coupled to an output node of the reference buffer wherein the first switched capacitor comprises at least one first capacitor and at least one first switch, the method comprising:

coupling a passive network to the output node of the reference buffer in response to a presence of a condition for encountering the voltage kickback in order to create an approximately equal and opposite voltage kickforward by the passive network to at least partially neutralize the voltage kickback, wherein the passive network is coupled to one or more voltage supplies for supplying at least one supply voltage to another component of the data converter, such that the electrical energy for creating the voltage kickforward is provided by the at least one supply voltage.

2. The method of claim 1, wherein the passive network comprises a second switched capacitor comprising at least one second capacitor and at least one second switch.

3. The method of claim 2, wherein:

the at least one second switch comprises two switches;
one of the two switches couples a first terminal of the at least one second capacitor to a first predefined voltage and the other of the two switches couples the first terminal to a second predefined voltage; and
a second terminal of the at least one second capacitor is coupled to the output node of the reference buffer.

4. The method of claim 3, wherein the first terminal of the at least one second capacitor is switched from being coupled to the first predefined voltage to being coupled to the second predefined voltage in response to activation of the at least one first switch.

5. The method of claim 3, wherein the first predefined voltage is one of a steady-state ground voltage and steady-state common-mode voltage and the second predefined voltage is a steady state supply voltage.

6. The method of claim 5, wherein:

the at least one first capacitor has a first capacitance; and
the at least one second capacitor has a second capacitance approximately equal to the first capacitance multiplied by a ratio equal to a steady state reference voltage generated at the output node of the reference buffer divided by the steady state supply voltage.

7. The method of claim 6, further comprising:

monitoring the steady state supply voltage; and
modifying the second capacitance responsive to changes of the steady state supply voltage in order to maintain the second capacitance approximately equal to the first capacitance multiplied by the ratio.

8. The method of claim 1, wherein the condition for encountering the voltage kickback occurs when a switch of the at least one first switch of the switched capacitor is closed.

9. The method of claim 8, wherein the at least one first switch is controlled by a clock signal defined by the data converter.

10. The method of claim 1, wherein coupling the passive network to the output node to create the voltage kickforward consumes approximately no additional quiescent power.

11. The method of claim 1, further comprising decoupling the reference buffer from the output node for at least a portion of a time in which the passive network is creating the voltage kickforward.

12. A circuit for a switched capacitor based data converter, comprising:

a reference buffer for generating a reference voltage at an output node of the reference buffer;

a first switched capacitor coupled to the output node of the reference buffer wherein the first switched capacitor comprises at least one first capacitor and at least one first switch; and a passive network configured to be coupled to the output node of the reference buffer in response to a presence of a condition for encountering a voltage kickback associated with the reference buffer in order to create an approximately equal and opposite voltage kickforward by the passive network to at least partially neutralize the voltage kickback, wherein the passive network is coupled to one or more voltage supplies for supplying at least one supply voltage to another component of the data converter, such that the electrical energy for creating the voltage kickforward is provided by the at least one supply voltage.

13. The circuit of claim 12, wherein the passive network comprises a second switched capacitor comprising at least one second capacitor and at least one second switch.

14. The circuit of claim 13, wherein:
the at least one second switch comprises two switches;
one of the two switches couples a first terminal of the at least one second capacitor to a first predefined voltage and the other of the two switches couples the first terminal to a second predefined voltage; and
a second terminal of the at least one second capacitor is coupled to the output node of the reference buffer.

15. The circuit of claim 14, wherein first terminal of the at least one second capacitor is switched from being coupled to the first predefined voltage to being coupled to the second predefined voltage in response to activation of the at least one first switch.

16. The circuit of claim 14, wherein the first predefined voltage is one of a steady-state ground voltage and steady-state common-mode voltage and the second predefined voltage is a steady state supply voltage.

17. The circuit of claim 16, wherein:
the at least one first capacitor has a first capacitance; and
the at least one second capacitor has a second capacitance approximately equal to the first capacitance multiplied by a ratio equal to a steady state reference voltage generated at the output node of the reference buffer divided by the steady state supply voltage.

18. The circuit of claim 17, further comprising a controller configured to:
monitor the steady state supply voltage; and
modify the second capacitance responsive to changes of the steady state supply voltage in order to maintain the second capacitance approximately equal to the first capacitance multiplied by the ratio.

19. The circuit of claim 12, wherein the condition for encountering the voltage kickback occurs when a switch of the at least one first switch of the switched capacitor is closed.

20. The circuit of claim 19, wherein the at least one first switch is controlled by a clock signal defined by the data converter.

21. The circuit of claim 12, wherein coupling the passive network to the output node to create the voltage kickforward consumes approximately no additional quiescent power.

22. The circuit of claim 12, further comprising a third switch configured to decouple the reference buffer from the output node for at least a portion of a time in which the passive network is creating the voltage kickforward.

23. A method of neutralizing voltage kickback associated with a reference buffer of a switched capacitor based data converter having a first switched capacitor coupled to an output node of the reference buffer wherein the first switched capacitor comprises at least one first capacitor and at least one first switch, the method comprising:
coupling a passive network to the output node of the reference buffer in response to a presence of a condition for encountering the voltage kickback in order to create an approximately equal and opposite voltage kickforward by the passive network to at least partially neutralize the voltage kickback, wherein:
the passive network comprises a second switched capacitor comprising at least one second capacitor and two switches;
one of the two switches couples a first terminal of the at least one second capacitor to one of a steady-state ground voltage and steady-state common-mode voltage and the other of the two switches couples the first terminal to a steady state supply voltage; and
a second terminal of the at least one second capacitor is coupled to the output node of the reference buffer.

24. The method of claim 23, wherein the first terminal of the at least one second capacitor is switched from being coupled to a first predefined voltage to being coupled to a second predefined voltage in response to activation of the at least one first switch.

25. The method of claim 23, wherein:
the at least one first capacitor has a first capacitance; and
the at least one second capacitor has a second capacitance approximately equal to the first capacitance multiplied by a ratio equal to a steady state reference voltage generated at the output node of the reference buffer divided by the steady state supply voltage.

26. The method of claim 25, further comprising:
monitoring the steady state supply voltage; and
modifying the second capacitance responsive to changes of the steady state supply voltage in order to maintain the second capacitance approximately equal to the first capacitance multiplied by the ratio.

27. The method of claim 23, wherein the condition for encountering the voltage kickback occurs when a switch of the at least one first switch of the switched capacitor is closed.

28. The method of claim 27, wherein the at least one first switch is controlled by a clock signal defined by the data converter.

29. The method of claim 23, wherein coupling the passive network to the output node to create the voltage kickforward consumes approximately no additional quiescent power.

30. The method of claim 23, further comprising decoupling the reference buffer from the output node for at least a portion of a time in which the passive network is creating the voltage kickforward.

31. A circuit for a switched capacitor based data converter, comprising:
a reference buffer for generating a reference voltage at an output node of the reference buffer;
a first switched capacitor coupled to the output node of the reference buffer wherein the first switched capacitor comprises at least one first capacitor and at least one first switch; and
a passive network configured to be coupled to the output node of the reference buffer in response to a presence of a condition for encountering a voltage kickback associated with the reference buffer in order to create an approximately equal and opposite voltage kickforward by the passive network to at least partially neutralize the voltage kickback; wherein:

the passive network comprises a second switched capacitor comprising at least one second capacitor and two switches;
one of the two switches couples a first terminal of the at least one second capacitor to one of a steady-state ground voltage and steady-state common-mode voltage and the other of the two switches couples the first terminal to a steady state supply voltage; and
a second terminal of the at least one second capacitor is coupled to the output node of the reference buffer.

32. The circuit of claim 31, wherein first terminal of the at least one second capacitor is switched from being coupled to a first predefined voltage to being coupled to a second predefined voltage in response to activation of the at least one first switch.

33. The circuit of claim 31, wherein:
the at least one first capacitor has a first capacitance; and
the at least one second capacitor has a second capacitance approximately equal to the first capacitance multiplied by a ratio equal to a steady state reference voltage generated at the output node of the reference buffer divided by the steady state supply voltage.

34. The circuit of claim 33, further comprising a controller configured to:
monitor the steady state supply voltage; and
modify the second capacitance responsive to changes of the steady state supply voltage in order to maintain the second capacitance approximately equal to the first capacitance multiplied by the ratio.

35. The circuit of claim 31, wherein the condition for encountering the voltage kickback occurs when a switch of the at least one first switch of the switched capacitor is closed.

36. The circuit of claim 35, wherein the at least one first switch is controlled by a clock signal defined by the data converter.

37. The circuit of claim 30, wherein coupling the passive network to the output node to create the voltage kickforward consumes approximately no additional quiescent power.

38. The circuit of claim 30, further comprising a third switch configured to decouple the reference buffer from the output node for at least a portion of a time in which the passive network is creating the voltage kickforward.

39. A method of neutralizing voltage kickback associated with a reference buffer of a switched capacitor based data converter having a first switched capacitor coupled to an output node of the reference buffer wherein the first switched capacitor comprises at least one first capacitor and at least one first switch, the method comprising:
coupling a passive network to the output node of the reference buffer in response to a presence of a condition for encountering the voltage kickback in order to create an approximately equal and opposite voltage kickforward by the passive network to at least partially neutralize the voltage kickback; and
decoupling the reference buffer from the output node for at least a portion of a time in which the passive network is creating the voltage kickforward.

40. The method of claim 39, wherein the passive network comprises a second switched capacitor comprising at least one second capacitor and at least one second switch.

41. The method of claim 40, wherein:
the at least one second switch comprises two switches;
one of the two switches couples a first terminal of the at least one second capacitor to a first predefined voltage and the other of the two switches couples the first terminal to a second predefined voltage; and
a second terminal of the at least one second capacitor is coupled to the output node of the reference buffer.

42. The method of claim 41, wherein the first terminal of the at least one second capacitor is switched from being coupled to the first predefined voltage to being coupled to the second predefined voltage in response to activation of the at least one first switch.

43. The method of claim 39, wherein the condition for encountering the voltage kickback occurs when a switch of the at least one first switch of the switched capacitor is closed.

44. The method of claim 43, wherein the at least one first switch is controlled by a clock signal defined by the data converter.

45. The method of claim 39, wherein coupling the passive network to the output node to create the voltage kickforward consumes approximately no additional quiescent power.

46. A circuit for a switched capacitor based data converter, comprising:
a reference buffer for generating a reference voltage at an output node of the reference buffer;
a first switched capacitor coupled to the output node of the reference buffer wherein the first switched capacitor comprises at least one first capacitor and at least one first switch;
a passive network configured to be coupled to the output node of the reference buffer in response to a presence of a condition for encountering a voltage kickback associated with the reference buffer in order to create an approximately equal and opposite voltage kickforward by the passive network to at least partially neutralize the voltage kickback and;
further comprising a third switch configured to decouple the reference buffer from the output node for at least a portion of a time in which the passive network is creating the voltage kickforward.

47. The circuit of claim 46, wherein the passive network comprises a second switched capacitor comprising at least one second capacitor and at least one second switch.

48. The circuit of claim 47, wherein:
the at least one second switch comprises two switches;
one of the two switches couples a first terminal of the at least one second capacitor to a first predefined voltage and the other of the two switches couples the first terminal to a second predefined voltage; and
a second terminal of the at least one second capacitor is coupled to the output node of the reference buffer.

49. The circuit of claim 48, wherein first terminal of the at least one second capacitor is switched from being coupled to the first predefined voltage to being coupled to the second predefined voltage in response to activation of the at least one first switch.

50. The circuit of claim 46, wherein the condition for encountering the voltage kickback occurs when a switch of the at least one first switch of the switched capacitor is closed.

51. The circuit of claim 50, wherein the at least one first switch is controlled by a clock signal defined by the data converter.

52. The circuit of claim 46, wherein coupling the passive network to the output node to create the voltage kickforward consumes approximately no additional quiescent power.

* * * * *